United States Patent
Choi et al.

(10) Patent No.: US 11,300,433 B2
(45) Date of Patent: Apr. 12, 2022

(54) FLEXIBLE TEMPERATURE-FLOW VELOCITY DUAL-PARAMETER SENSORS

(71) Applicant: KOREA UNIVERSITY RESEARCH AND BUSINESS FOUNDATION, Seoul (KR)

(72) Inventors: Wonjoon Choi, Seoul (KR); Byungseok Seo, Seoul (KR)

(73) Assignee: Korea University Research and Business Foundation, Seoul (KR)

(*) Notice: Subject to any disclaimer, the term of this patent is extended or adjusted under 35 U.S.C. 154(b) by 824 days.

(21) Appl. No.: 16/142,143

(22) Filed: Sep. 26, 2018

(65) Prior Publication Data
US 2019/0204132 A1    Jul. 4, 2019

(30) Foreign Application Priority Data
Dec. 29, 2017    (KR) .................. 10-2017-0184409

(51) Int. Cl.
*G01F 1/688*    (2006.01)
*H01L 35/10*    (2006.01)
(Continued)

(52) U.S. Cl.
CPC .......... *G01F 1/6888* (2013.01); *G01F 15/022* (2013.01); *G01K 1/00* (2013.01);
(Continued)

(58) Field of Classification Search
CPC . G01F 1/86; G01F 1/6842; G01F 1/88; G01F 1/684; G01F 5/00; G01F 1/688;
(Continued)

(56) References Cited

U.S. PATENT DOCUMENTS 3,745,827 A * 7/1973 Swanson ................. G01F 15/02
                                                        73/233
4,475,387 A * 10/1984 Hawk .................... G01F 1/6847
                                                        73/202.5
(Continued)

FOREIGN PATENT DOCUMENTS

KR    10-1211998 B1    12/2012
KR    10-1493792 B1     2/2015
(Continued)

OTHER PUBLICATIONS

Korean Office Action issued in corresponding Korean Patent Application No. 10-2017-0184409 (4 pages in Korean).

*Primary Examiner* — Peter J Macchiarolo
*Assistant Examiner* — Mohammed E Keramet-Amircolai
(74) *Attorney, Agent, or Firm* — NSIP Law

(57) ABSTRACT

The present description includes a flexible sensor including a flexible substrate, a thermoelectric substrate formed on the flexible substrate, a first metal electrode that is formed on the flexible substrate and is connected to one end of the thermoelectric body, and a second metal electrode that is formed on the flexible substrate and is connected to another end of the thermoelectric body but spaced apart from the first metal electrode. The flexible sensor simply measures the temperature and the flow velocity with high accuracy. The change in temperature and flow velocity may be measured in real time. In addition, the flexible sensor may measure the temperature and the flow velocity of a fluid even when attached to a curved surface, and self-development is possible by the measurement.

11 Claims, 16 Drawing Sheets

(51) Int. Cl.
   *G01F 15/02* (2006.01)
   *H01L 35/18* (2006.01)
   *G01K 1/00* (2006.01)
   *H01L 35/32* (2006.01)

(52) U.S. Cl.
   CPC .............. *H01L 35/10* (2013.01); *H01L 35/18* (2013.01); *H01L 35/32* (2013.01)

(58) Field of Classification Search
   CPC ...... G01F 15/02; G01F 1/6888; G01F 15/022; H01L 35/10; H01L 35/18; H01L 35/32
   USPC ...................................................... 73/861.02
   See application file for complete search history.

(56) References Cited

U.S. PATENT DOCUMENTS

| | | | | |
|---|---|---|---|---|
| 2015/0338267 A1* | 11/2015 | Kang | .................. | G01J 1/42 |
| | | | | 250/339.07 |
| 2016/0033549 A1* | 2/2016 | Kang | .................. | G01Q 60/22 |
| | | | | 850/32 |
| 2016/0072036 A1* | 3/2016 | Kim | .................. | H01L 35/32 |
| | | | | 136/205 |
| 2016/0079508 A1* | 3/2016 | Kim | .................. | H01L 35/32 |
| | | | | 136/212 |
| 2016/0251992 A1* | 9/2016 | Kim | .................. | H01L 35/34 |
| | | | | 136/205 |

FOREIGN PATENT DOCUMENTS

| | | |
|---|---|---|
| KR | 10-1693604 B1 | 1/2017 |
| KR | 10-2017-0126304 A | 11/2017 |

\* cited by examiner

FLEXIBLE TEMPERATURE-FLOW VELOCITY DUAL-PARAMETER SENSORS

CROSS-REFERENCE TO RELATED APPLICATIONS

This application claims the benefit under 35 U.S.C. 119(a) of Korean Patent Application No. 10-2017-0184409 filed on Dec. 29, 2017 in the Korean Intellectual Property Office, the entire disclosure of which is incorporated herein by reference for all purposes.

BACKGROUND

1. Field

The following description relates to flexible temperature-flow velocity dual-parameter sensors, and in detail, to a flexible fluid temperature-flow velocity sensor utilizing geometrical patterns of thermoelectric materials and a flexible sensor array including a plurality of the flexible sensors.

2. Description of Related Art

Among the various measurements related to the environment of fluids, the velocity and the temperature of fluids are the most basic and important variables in predicting the fluidity of fluids. The density and viscosity of a fluid may be predicted by measuring the temperature of the fluid, and the flow rate of the fluid may be predicted by measuring the flow rate of the fluid.

Korean Patent Registration No. 10-1693604 discloses an invention capable of measuring the flow velocity of a fluid flowing through inside a pipe by using a pipe in which a fluid can move, a float unit floating on a fluid flowing inside the pipe, and a magnetic material formed on the outer surface of the pipe. However, the invention has the restriction that it can measure only the flow velocity of a fluid and uses magnetism; it involves a risk that the properties of the fluid may be changed due to the addition of a float unit which is a kind of float in the fluid, and it has a problem that the invention needs to a magnetic material consistent with the size and shape of the pipe inside which the fluid will flow.

Korean Patent Registration No. 10-1211998 discloses a temperature sensor for measuring the temperature inside a pipe or inside a pipe of a tubular reaction furnace. The invention has a disadvantage that it is impossible to measure the flow velocity of a fluid, and it has a problem that a unit for measuring temperature needs to be inserted into a pipe such that the movement of the fluid may be interfered. In addition, the requirement that an additional pipe having a groove be prepared to install the temperature sensor is also important restriction of the invention.

Both inventions require that additional devices be installed to operate a sensor. The requirement of the separate addition of a power supplier means that: an additional space-occupying device should be installed in addition to a pipe; a long line should be used when space is not sufficient; it should be satisfied with the use of a battery having a short life span and so on. Therefore, it can be inferred that there will be some restrictions to constant observation of a fluid.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The present description is introduced to solve the problems above and it may provide a sensor for measuring temperature and flow velocity of a fluid both.

The present description may provide a sensor for measuring both temperature and flow velocity of a fluid without disturbing the flow of the fluid.

The present description may provide a sensor with flexibility for measuring temperature and flow velocity of a fluid flowing along a curved route.

The present description may provide a sensor driven and running semi-permanently without any additional power supply.

In one general aspect, there is provided a flexible sensor including: a flexible substrate; a thermoelectric body formed on the flexible substrate; a first metal electrode that is formed on the flexible substrate and is connected to one end of the thermoelectric body; and a second metal electrode that is formed on the flexible substrate and is connected to another end of the thermoelectric body but spaced apart from the first metal electrode.

The thermoelectric body may include a first connection point connected to the first metal electrode at one point, and a second connection point and a third connection point connected to the second metal electrode at two points separated.

The flexible sensor may further include a protection layer formed on the first metal electrode, the second metal electrode, and the thermoelectric body.

The thermoelectric body may branch at a split point spaced apart from the first connection point and may be connected to the second connection point and the third connection point, and the second connection point and the third connection point may be spaced apart. A length of a branch from the split point to the second connection point and a length of a branch of the thermoelectric body from the split point to the second connection point may be different from each other.

The thermoelectric body may branch at a split point located spaced apart from the first connection point by an interval and may be connected to the second connection point and the third connection point, and the second connection point and the third connection point may be spaced apart. A bending structure of the branch from the split point to the second connection point and a bending structure of the branch from the split point to the third connection point may differ from each other.

A thermoelectric element included in the thermoelectric body may include at least one of bismuth chalcogenide compounds and antimony chalcogenide compounds.

The thickness of the thermoelectric body may be in a range of about 50 nm to about 1 μm.

The protection layer may include at least one selected from a group of poly methyl methacrylate, polystyrene, phenolic polymer, acrylic polymer, imide polymer such as polyimide, aryl ether-based polymer, amide-based polymer, fluorine-based polymer, p-xylylene-based polymer, vinyl alcohol polymer, parylene, and a compound including at least one thereof.

The thickness of the protection layer may be in a range of about 1 μm to about 50 μm.

In another general aspect, a flexible sensor array includes a plurality of the above-mentioned flexible sensors. Each thermoelectric body of the plurality of flexible sensors is partially or entirely exposed to a fluid to be measured, and the flexible sensors are connected to each other in parallel.

A flexible sensor of the present description may be fabricated in the form of a thin film, thereby measuring both the temperature and flow velocity of a fluid with a high accuracy but without obstructing the flow of the fluid to be measured.

In addition, a flexible sensor of the present description may allow the variation of the curvature, thereby measuring even the temperature and flow velocity of a fluid flowing along a curved path with accuracy.

In addition, a flexible sensor of the present description may allow self-power generation by utilizing the temperature of a fluid to be measured as an energy source such that it may be driven without separate power supply.

In addition, a flexible sensor of the present description may be attached to a pipe without processing the inside or the outside of the pipe in a specific shape such that the sensor is easy to use even for existing pipes.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
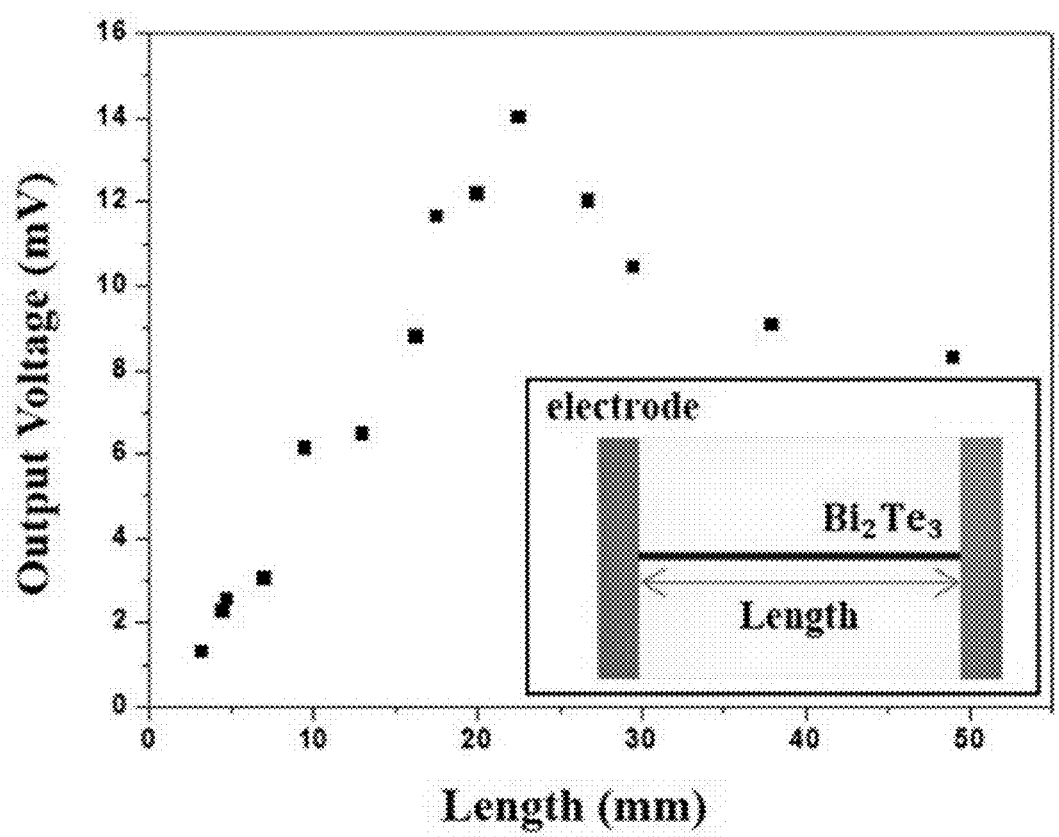
FIGS. 1A and 1B are schematic diagrams for explaining the basic structure of and operating principle of a flexible sensor of the present description and experimental data on the longitudinal variables of a thermoelectric body 130 included in the flexible sensor.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The Simplest Example of a Flexible Sensor of the Present Description

A flexible sensor of the present description may include: a flexible substrate 100; a thermoelectric body 130 formed on the flexible substrate 100; a first metal electrode 110 formed on the flexible substrate 100 and connected to a portion of the thermoelectric body 130; and a second metal electrode 120 that is formed on the flexible substrate 100, and that is spaced apart from the first metal electrode 110 and is connected to another portion of the thermoelectric body 130. The roles and examples of each element are described in the below.

<Flexible Substrate of the Present Description>

The flexible substrate 100 of the present description may function as a substrate because the thermoelectric body 130 and a metal electrode are formed on one surface of the flexible substrate. In addition, the flexible substrate 100 may have flexible property. The flexible property refers to that even if the flexible substrate 100 is physically transformed by an external force, no trouble is caused in the performance of the function, and the physical transformation refers to that the curvature of the substrate 100 is transformed to wrap. The flexible property is needed for the flexible substrate 100 because there are many cases that facilities such as pipes through which fluids flow have a certain curvature. The thermoelectric body 130 and the metal electrode are bendable, so the flexible sensor is characterized by that an entire sensor is bendable.

However, it is not necessary for the flexible substrate 100 to have flexible property, and a substrate which is not flexible may be used depending on the usage or purpose of the sensor. It is possible to consider both cases in which the flexibility cannot be ensured or does not have to be ensured, and it is possible to select a substrate suitable for each purpose. For example, in order to measure the properties of a fluid having a very high temperature, it is necessary to select a substrate having a high melting point. In such a case, a non-flexible thermoplastic polymer may be selected as a substrate 100.

Therefore, the substrate 100 of the present description is referred to as a flexible substrate, but this is not limited to a substrate with flexibility. That is, although examples of the flexible substrate 100 are presented in the below, the flexible substrate is not limited thereto. A person skilled in the art will be able to modify the idea described in the present description to select a suitable substrate for the purpose of the use.

The flexible substrate 100 may be made of one of poly dimethyl siloxane (PMS), polyimide, poly carbonate, poly methyl methacrylate (PMMA), cyclo olefin copolymer (COC), parylene, polyethylene terephthalate (PET), polybutylene terephthalate (PBT), polysilane, polysiloxane, polysilazane, polycarbosilane, polyacrylate, polymethacrylate, polymethylacrylate, polymethyl methacrylate (PMMA), polyethylacrylate, polyethylmetacrylate, cyclic olefin polymer (COP), polyethylene (PE), polypropylene (PP), polystyrene (PS), polyacetal (POM), polyetheretherketone (PEEK), polyethersulfone (PES), polytetrafluoroethylene (PTFE), polyvinyl chloride (PVC), polyvinylidene fluoride (PVDF), and perfluoroalkoxy alkanes (PFA) or a combination thereof.

<Metal Electrode of the Present Description>

A first metal electrode 110 and a second metal electrode 120 may be attached to one surface of the flexible substrate 100, and a surface to which the first metal electrode 110 is attached and a surface to which the second metal electrode 120 is attached may be the same surface. The term "attached" refers to that two objects attached to each other are not separated from each other and is used as a comprehensive concept including bond, adhesion, deposition, and so on.

However, the first metal electrode 110 and the second metal electrode 120 are assumed to be metal, so they may be attached to the flexible substrate 100 by deposition. The method of deposition is largely classified into Chemical Vapor Deposition (CVD) and Physical Vapor Deposition (PVD). The CVD is a method of inducing a chemical reaction on the surface of the flexible substrate 100 to be deposited, and the PVD is a method of increasing the kinetic energy of a substance to be deposited such that it is accumulated on the surface of the substrate 100.

In addition, the first metal electrode 110 and the second metal electrode 120 are assumed to be used as electrodes, so the PVD method may be applied to attach the electrodes to the substrate 100. That is because the purity of the first metal electrode 110 and the second metal electrode 120 can be easily increased by the PVD method. The higher the purity of the first metal electrode 110 and the second metal electrode 120 is, the less noise is generated in measuring the temperature and the flow velocity of fluid. However, the present description is not limited thereto, and methods such as Metal-Organic Chemical Vapor Deposition which is used for manufacturing semiconductor devices, and so on may be applied to the present description.

The PVD method includes Thermal Evaporation Decomposition (TED), Sputtering Decomposition (SD), Ion-beam Assisted Decomposition, and so on. As a method for depositing the metal electrodes of the present description, the PVD methods described above are all possible. For example, the deposition of the metal electrodes may be executed by any one of RF sputtering which is an example of sputtering decomposition, RF magnetron sputtering, Ion-beam sputtering, High-target-utilization sputtering (HiTUS), and High-power impulse magnetron sputtering (HiPIMS).

In addition, the first metal electrode 110 and the second metal electrode 120 may be attached to the same surface of the substrate but are spaced apart from each other. In this case, the term "separated" refers to fall apart at regular intervals. If the two metal electrodes are not spaced apart, they cannot function as individual electrodes.

For example, when the first metal electrode 110 functions as an anode, the second metal electrode 120 functions as a cathode. In contrast, when the first metal electrode 110 functions as a cathode, the second metal electrode 120 functions as an anode. It should be noted that the first metal electrode 110 may be designed as an anode or as a cathode.

A variety of metals may be used as the materials of the first metal electrode 110 and the second metal electrode 120. For example, it may be at least one or two of copper (Cu), nickel (Ni), platinum (Pt), ruthenium (Ru), rhodium (Rh), gold (Au), tungsten (W), cobalt (Co), palladium (Pd), titanium (Ti), tantalum (Ta), iron (Fe), molybdenum (Mo), hafnium (Hf), lanthanum (La), iridium (Ir) and silver (Ag). In addition, a metal electrode of a metal electrode layer may further include nonmetallic elements such as oxygen (O) and so on.

In addition, the first metal electrode 110 and the second metal electrode 120 may further include a conductive material. As the conductive material, isotropic particles, anisotropic particles, or mixed particles of isotropic particles and anisotropic particles may be considered. In the case of isotropic particles, it is possible to realize homogeneous and stable electrical characteristics because of excellent space filling characteristics, but there is a disadvantage that a contact radius is relatively narrow. On the other hand, in the case of anisotropic particles, the relatively large area contact as compared with isotropic particles is possible, so the conduction characteristics of the electrode can be prevented from being damaged even if a sensor of the present description is physically highly deformed. For example, if the metal electrode further includes a material having flexibility by nature or nano dimension such as carbon nanotube, carbon nanowire, and silver nanowire, the flexibility of the electrode itself may further increase.

In addition, although the first metal electrode 110 and the second metal electrode 120 may include different metals, it is desired that they have the same configuration in order to increase the performance as a sensor. It may also be desirable to use copper (Cu) in terms of high electrical conductivity and manufacturing cost.

However, the first metal electrode 110 and the second metal electrode 120 need not be identical in appearances, but it is desirable that the first metal electrode 110 and the second metal electrode 120 have the same thickness when considering the contact and fixing with the thermoelectric body 130. Also, since the thermoelectric body 130 is the most important component in measuring the temperature and the flow velocity of the fluid, it is desirable that the thickness (height) of the first metal electrode 110 and the second metal electrode 120 is equal to or smaller than the thickness of the thermoelectric body 130 so that the exposure of the thermoelectric body 130 may be maximized.

<Thermoelectric Body of the Present Description>

In this specification, the thermoelectric body 130 is used as a generic term referring to the entire thermoelectric element included in the flexible sensor of the present description. A branch of the thermoelectric body 130 is hereinafter referred to as the term "branch." The term "branch" refers to a thermoelectric body with a certain geometric pattern between a split point and a second connection point or a thermoelectric body with a certain geometric pattern between a split point and a third connection point, in which the geometric patterns may differ. Therefore, it is assumed that the term "branch" is basically a portion of the thermoelectric body 130. However, it should be understood that the element referred to as "thermoelectric body" does not necessarily refer to the entire thermoelectric body. Whether the term refers to the entire thermoelectric body or a specific portion of the thermoelectric body should be construed in light of the context in which the term is written.

In addition to the term "thermoelectric body," generic terms such as "geometric patterns," may be used to refer to both the entire geometric pattern and the 'geometric pattern of a branch' which is a portion of the entire geometric pattern, as similar to the term "thermoelectric body" above.

It also should be understood that the term "connection point" of "first connection point," "second connection point," and "third connection point" which will be described later is not limited to connection among points and the connections among points, lines or planes are included.

The thermoelectric body 130 is a layer functioning as a key in measuring temperature and flow velocity of a fluid. The thermoelectric body 130 basically includes a thermoelectric element. The thermoelectric element refers to an element that absorbs and changes external thermal energy into electric energy or changes external electric energy into thermal energy. The effect of thermal energy conversion into electrical energy is referred to as Seebeck effect, and the effect of electrical energy conversion into thermal energy is referred to as Peltier effect. The thermoelectric element refers to an element measuring the temperature and flow velocity of a fluid by using Seebeck effect. In other words, the thermoelectric body 130 performs a function of absorbing a part of thermal energy of an external fluid and changing it into electric energy. It does not necessarily have to utilize Seebeck effect. It is also conceivable to use Peltier effect by making some configuration changes. In such a case, several values of current may be measured inversely.

In detail, it is possible to simply measure the temperature of the fluid or to measure both the temperature and the flow velocity of the fluid by varying the geometric pattern of the thermoelectric body 130. While the present description contemplates one characteristic and unique effect of simultaneously measuring the temperature and the flow velocity of a fluid, it is important to note that a sensor for simply measuring the temperature of a fluid is also included in the spirit of the present description. A detailed mechanism for measuring the temperature and flow velocity of a fluid will be described later.

The shape of the thermoelectric body 130 may vary. For example, the thermoelectric body 130 may be in the form of a plate or a line. However, in measuring the temperature and flow velocity of the fluid, it is desirable that the thermoelectric body 130 is in the form of a line in order to easily analyze data measured. In particular, when the width in the form of a line is constant, data interpretation is the easiest.

In addition, it is desirable that the thermoelectric body 130 have a thickness (height) equal to or greater than that of the first metal electrode 110 and the second metal electrode 120, as described above. However, in order to minimize the resistance of a fluid, it is probably the most desirable that the thickness of the first metal electrode 110 and the second metal electrode 120 is the equal to that of the thermoelectric body 130. In addition, it is the most desirable that the first metal electrode 110, the second metal electrode 120, and the thermoelectric body 130 all have the uniform thickness.

As a thermoelectric element included in the thermoelectric body 130, a chalcogenide compound which is N-type may be selected. An N-type chalcogenide compound absorbs external thermal energy to generate an electron flow. In particular, bismuth chalcogenides and antimony chalcogenides out of chalcogenide compounds shows excellent sensitivity in measuring the temperature of a fluid between 10° C. and 150° C. Therefore, it is desirable to use bismuth chalcogenides and antimony chalcogenides as a thermoelectric body in measuring the temperature and flow velocity of a fluid which is easily obtained in daily life. However, in consideration of the temperature range of a fluid to be measured, the chalcogenide compounds may be further doped with ions of metals such as Hg, Ta, Mn, and Pb, and also, it is possible to select a thermoelectric element in addition to the chalcogenide compounds in consideration of the range.

FIG. 1 is a schematic diagram for explaining the basic structure of and operating principle of a flexible sensor of the present description and experimental data on the longitudinal variables of a thermoelectric body 130 included in the flexible sensor. Referring to FIG. 1, it is possible to figure out mechanism how the flexible sensor of the present description estimates the temperature of a fluid by converting a process of changing thermal energy into electric energy into a signal.

FIG. 1A shows data obtained by measuring a voltage generated by external thermal energy with different lengths of a thermoelectric body 130. A first metal electrode 110 and a second metal electrode 120 were copper (Cu), and the thermoelectric material was the same as $Bi_2Te_3$. The experiment was carried out under the same conditions of temperature and flow velocity of the fluid. Referring to FIG. 1A, it is seen that the amount of a generated voltage increases as the length of the thermoelectric body 130 increases up to a certain length, but the amount of the generated voltage decreases inversely when it exceeds the certain length.

Figure 1B:
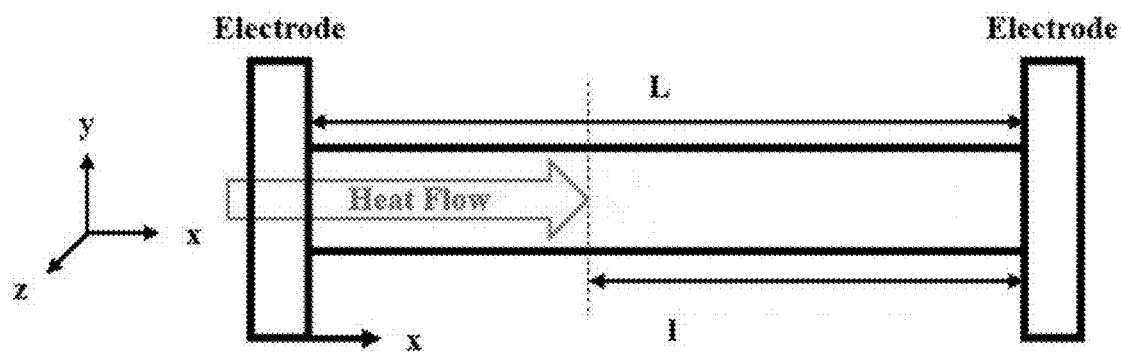

It is necessary to refer to FIG. 1B in order to understand how the voltage is generated as described above. FIG. 1B is a model under an assumption of a situation in which a hot fluid flows over the thermoelectric body 130, where L is the total length of the thermoelectric body 130, and I is the effective length that no hot fluid flows yet. The region subtracted from L by I is considered as a saturated region in the thermal aspect.

In a static situation where the heat source does not flow, the thermoelectric effect is expressed as a constant value. This means that the value of an electric energy generated by the saturated region in the thermal aspect appears as a constant. On the other hand, when the heat source flows, the analysis becomes complicated. If the situation where the heat source flows is referred to as a dynamic situation, the drift velocity ($V_d$) increases as the effective length decreases due to the fluid flow as a heat source in a dynamic situation. In this case, the drift velocity refers to the net flow velocity of active electrons.

The reduction of the flow velocity leads to a reduction of the total voltage generated by the thermoelectric body 130. Compared with the static thermoelectric effect, the following equation is established between a voltage value ($V_{exc.}$) generated excessively by the above-mentioned dynamic thermoelectric effect, a total length (L) of the thermoelectric body 130, and a temperature difference ($\Delta T$) between the temperature of a fluid which is a heat source and the initial temperature of the thermoelectric body 130 (where $R_{act}$ is a resistance value of the flexible sensor of the present description and S is a Seebeck coefficient value).

$$V_{exc.} = \left(c_2 - c_1 \cdot \frac{1}{L}\right) \cdot R_{act.} - S \cdot \Delta T$$

If the value of L is constant, the $R_{act}$, which is the resistance value of each individual flexible sensor, is also constant. Therefore, it is possible to interpret the value of a voltage to be measured as a difference value ($\Delta T$) between the initial temperatures of the fluid as a heat source and the thermoelectric body 130. This means that the temperature of the fluid can be measured by converting the measured voltage value inversely.

The thickness of the thermoelectric body 130 may be between 50 nm and 1 μm. If the thickness of the thermoelectric body 130 is greater than or equal to 1 μm, the increase of the resistance of the thermoelectric body 130 and the electromagnetic interference phenomenon in the vertical direction become remarkable, and it becomes difficult to measure the difference in a fine temperature and the difference in a flow velocity. Conversely, if the thickness of the thermoelectric body 130 is less than or equal to 50 nm, there is a great risk that the thermoelectric body 130 deposited in the form of nanoparticles will lose uniformity and connectivity in the physical deformation process of the flexible sensor.

<Connection Pattern Between Thermoelectric Body and First Metal Electrode and Second Metal Electrode of the Present Description>

The thermoelectric body may include a first connection point 111 connected to the first metal electrode 110 at one point and a second connection point 121 and a third connection point 122 connected to the second metal electrode 120 at two separated points.

The term "connected" refers to that the first metal electrode 110 and the thermoelectric body 130 are physically and electrically connected to each other and that the second metal electrode 120 and the thermoelectric body 130 are physically and electrically connected to each other.

Being physically connected refers to that there is a physical contact, and being electrically connected refers to a state where electricity can flow. The basic structure is that the metal electrodes and the thermoelectric body are physically and electrically connected to each other, but the structure is not limited thereto.

In addition, the term "connected" is a generic expression that can be used in various ways such as being touched, embedded, joined, combined, and extended and includes a variety of connecting patterns. For example, a method in which a groove is formed at one point of the first metal electrode 110 and the thermoelectric body 130 is inserted and connected to the groove is also one embodiment of the present description. Similarly, the form where an end portion of the thermoelectric body 130 is covered with a portion of the first metal electrode 110 is also another embodiment of the present description. That is, a different physical connecting pattern between the thermoelectric body 130 and the first metal electrode 110 and the second metal electrode 120 does not mean that it is not included in the scope of the present description.

The thermoelectric body 130 and the second metal electrode 120 may be connected at two spaced points. By connecting the second metal electrode 120 and the thermoelectric body 130 at two spaced points, it is possible to observe two different signals when measuring a fluid by the flexible sensor of the present description. The signal refers to a signal (peak) appearing in the form of an increase in the voltage value on an oscilloscope. The connection between the second metal electrode 120 and the thermoelectric body 130 is described in more detail in the below.

The thermoelectric body 130 is branched at a split point 131 spaced apart from a first connection point 111 connected to the first metal electrode 110 by a predetermined distance and is connected to the second metal electrode 120, a second connection point 121, and a third connection point 122, in which the second connection point and the third connection point 122 are spaced apart. It is desirable that the geometric pattern from the split point 131 to the second connection point 121 is different from the geometric pattern from the split point 131 to the third connection point 122.

The geometric pattern is a comprehensive meaning that includes the length difference of branches of the thermoelectric body, and the difference in the bending structure, and so on. As an example of the different geometric patterns, the length of the branch from the split point 131 to the second connection point 121 is different from the length of a branch from the split point 131 to the third connection point 122. As another example of the different geometric pattern, the bending structure of a branch from the split point 131 to the second connection point 121 is different from the bending structure of a branch from the split point 131 to the third connection point 122.

It should be noted that if the length and the bending structure from the split point 131 to the second connection point 121 and the length and the bending structure from the split point 131 to the third connection point 122 are equal to each other, only one signal may be observed when measuring a fluid, or even if two signals are observed, it may be impossible to separate them significantly.

Precisely, it is one of core ideas of the present description that two separable signals can be observed if the second connection point 121 and the third connection point 122 spaced apart from each other are positioned on the second metal electrode 120 and a geometric pattern from the split point 131 to the second connection point 121 differs from the a geometric pattern from a geometric pattern from the split point 131 to the second connection point 122. Geometric patterns will be described later in more detail with reference to the drawings.

The following description will be described in more detail with reference to the accompanying drawings and examples. However, it should be understood that the drawings and examples set forth herein may be modified in various ways by those skilled in the art, and the present description is not intended to limit the invention to the particular forms. It should be understood that the invention includes all equivalents and substitutions that fall within the spirit and scope of the invention. In addition, the accompanying drawings are included to provide a further understanding of the present description to those skilled in the art and may be exaggerated or reduced in size.

Figure 2A:
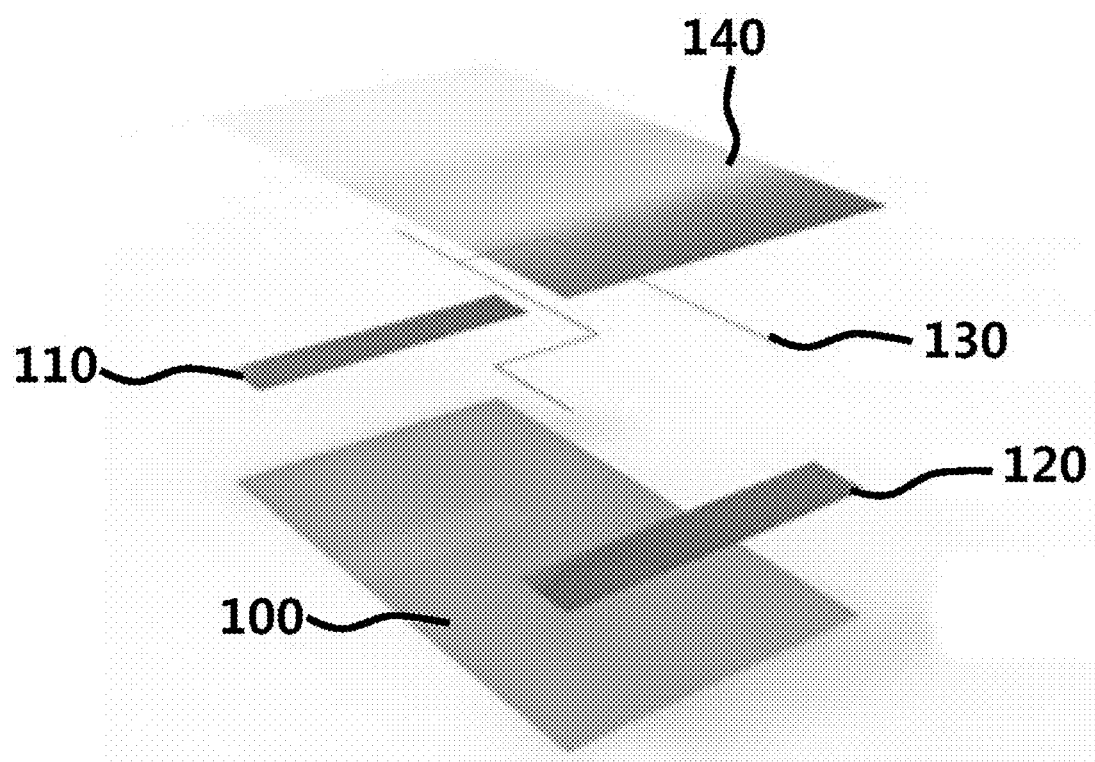
FIG. 2A is a schematic view of the structure of a flexible sensor according to the present description.

FIG. 2 is a schematic view of the structure of a flexible sensor according to the present description and a photograph of an embodiment of the present description. FIG. 2A shows a schematic view of a flexible sensor including a flexible substrate 100, a thermoelectric body 130 formed on the flexible substrate 100, a first metal electrode 110 formed on the flexible substrate 100 and connected to an end of the thermoelectric body 130; a second metal electrode 120 formed on the flexible substrate 100 and connected to an end of the thermoelectric body 130 but spaced apart from the first metal electrode 110, and a protection layer 140 formed on the thermoelectric body 130. It is seen that the first metal electrode 110, the second metal electrode 120, and thermoelectric body 130 are located between the flexible substrate 100 and the protection layer 140.

Figure 2B:
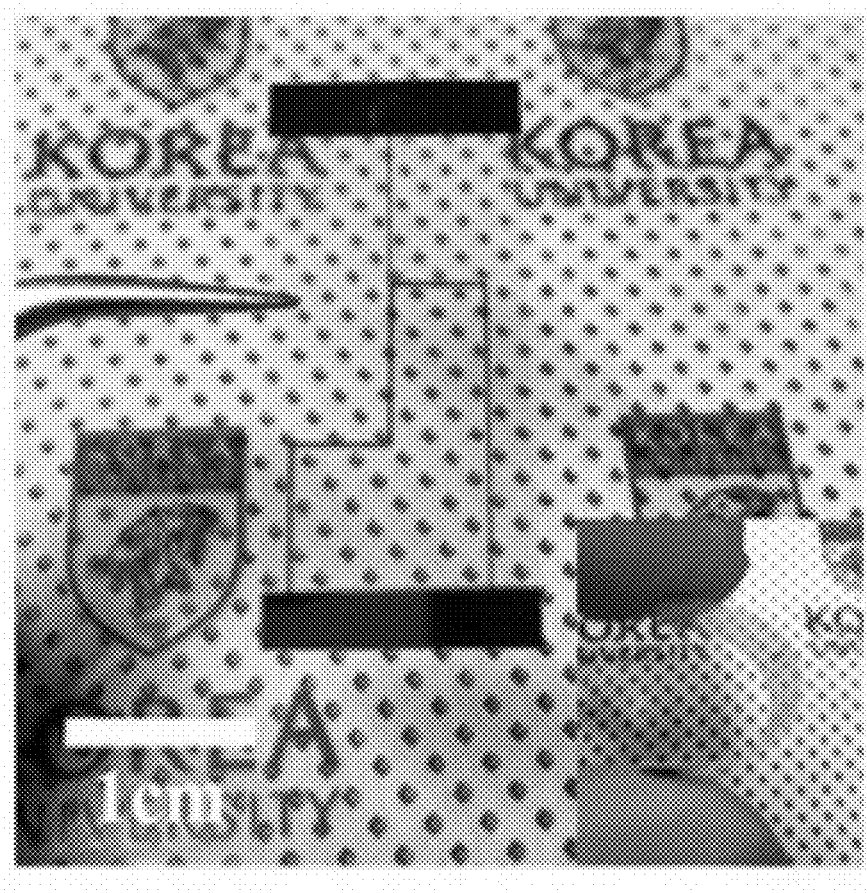
FIG. 2B is a photograph of an embodiment of the present description.

FIG. 2B is a photograph of an actual image of an example according to the present description. It is seen that the thermoelectric body is connected to the second metal electrode 120 at two different points and that the geometric pattern of a branch from a split point 131 to a second connection point 121 and the geometric pattern of a branch from a split point 131 to a third connection point 122 are different. The branch from the split point 131 to the third connection point 122 has a geometric pattern where a point at which the branch initially turned is spaced apart from the split point 131 in terms of horizontal position, whereas the branch from the split point 131 to the second connection point 121 has a geometric pattern where a point at which the branch is initially turned is identical to the split point 131 in terms of horizontal position.

In the following drawings, a mechanism by which the flexible sensor according to the present description can simultaneously measure the temperature and flow velocity of a fluid to be measured, based on a thermoelectric body having the above-mentioned geometric pattern, will be described in detail. The above-mentioned geometric pattern refers to that the branch from the split point 131 to the third connection point 122 has a geometric pattern where a point at which the branch initially turned is spaced apart from the split point 131 in terms of horizontal position, whereas the branch from the split point 131 to the second connection point 121 has a geometric pattern where a point at which the branch is initially turned is equal to the split point 131.

FIG. 3 shows examples and measured data of temperature and flow velocity measurement related to a flexible sensor according to an embodiment. Referring to FIG. 3A, the length starting from a point where the thermoelectric body is bent to a second connection point 121 among the branch from the split point 131 to the second connection point 121 is defined as $Y_1$. Also, the length starting from the split point 131 to a point where the thermoelectric body is bent among the branch from the split point 131 to the third connection point 122 is defined as $Y_2$. The length of the width direction section from the split point 131 to the third connection point 122 is defined as X.

Figure 3A:
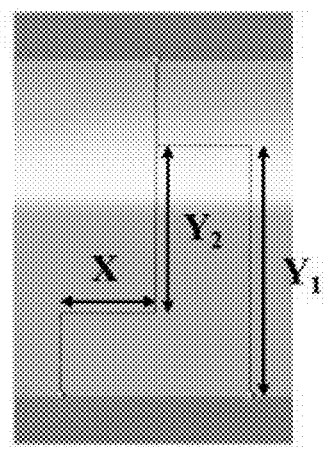
FIGS. 3A to 3D show examples and measured data of temperature and flow velocity measurement related to an example of a flexible sensor.
Figure 3B:
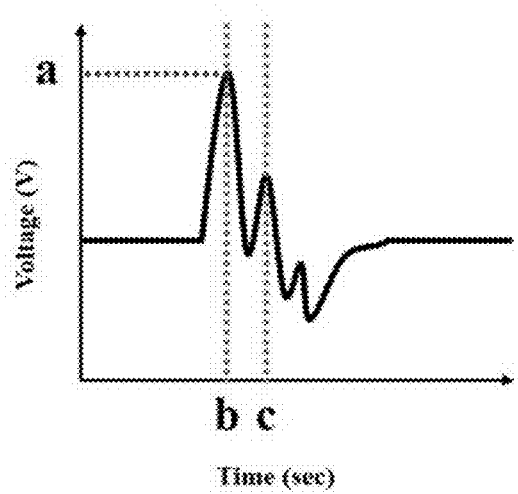

It is expected that the flexible sensor having the geometric patterns as shown in FIG. 3A will provide the measurement data as shown in FIG. 3B when the sensor is exposed to a fluid to be measured. The X-axis on the graph of FIG. 3B represents time and the Y-axis represents voltage. The temperature of the fluid may be measured based on the voltage value a appearing at the time point b and the flow velocity may be measured based on the interval between the time point c and the time point b.

Figure 3C:
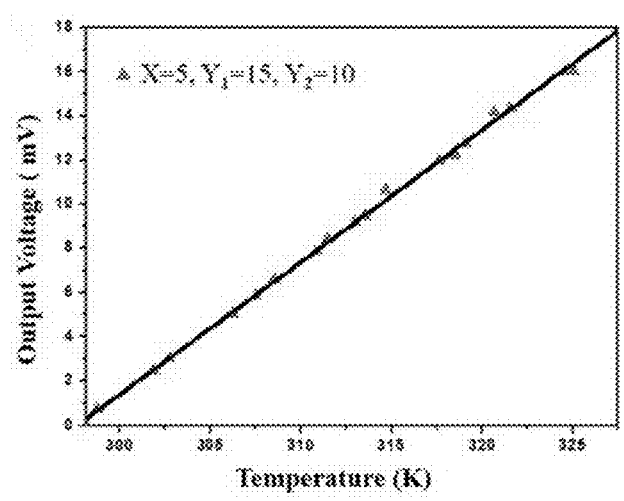
Figure 3D:
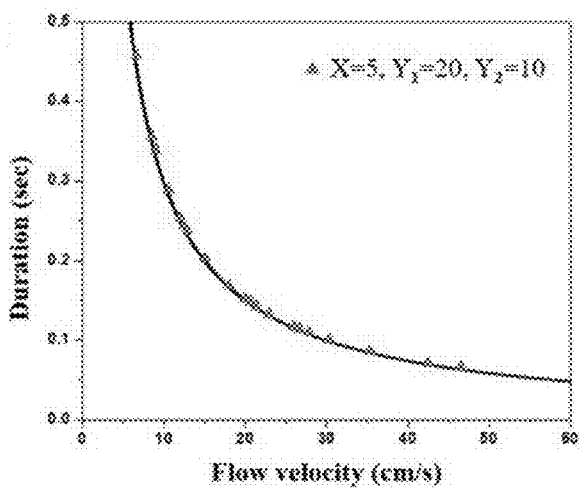

FIGS. 3C and 3D show actual measurement data when the values of three variables for determining the geometric pattern are X=5, $Y_1$=15, and $Y_2$=10. FIG. 3C shows voltage values specified by varying the temperature, and FIG. 3D shows the difference between the time point c and the time point b (hereinafter referred to as "duration") by varying the flow velocity. The points on FIG. 3C and FIG. 3D are values measured, and a solid black line shows the trend.

Referring to FIG. 3C, as a fluid temperature increase from about 300 k to about 325 K, the voltage value increases in direct proportion from 0 mV to 18 mV. Referring to FIG. 3D, as the flow velocity of the fluid increases from about 10 cm/s to about 50 cm/s, the duration value decreases in inverse proportion from about 0.5 s to about 0.05 s.

FIG. 4 illustrates the accuracy of a flexible sensor with respect to temperature and flow velocity of a fluid to be measured. The black dots shown in FIGS. 4A and 4D are the values obtained by measuring the temperature and the flow velocity of a fluid by a flexible sensor. FIGS. 4B, 4C, 4E, and 4F are temperature and flow velocity of a fluid measured by a thermocouple, a ultra high speed camera, an IR camera, and so on.

Figure 4A:
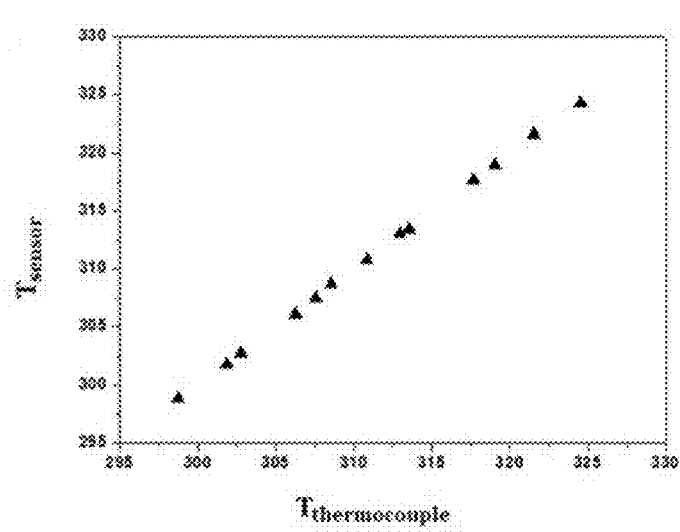
FIGS. 4A to 4F illustrate the accuracy of a flexible sensor with respect to temperature and flow velocity of a fluid to be measured.
Figure 4B:
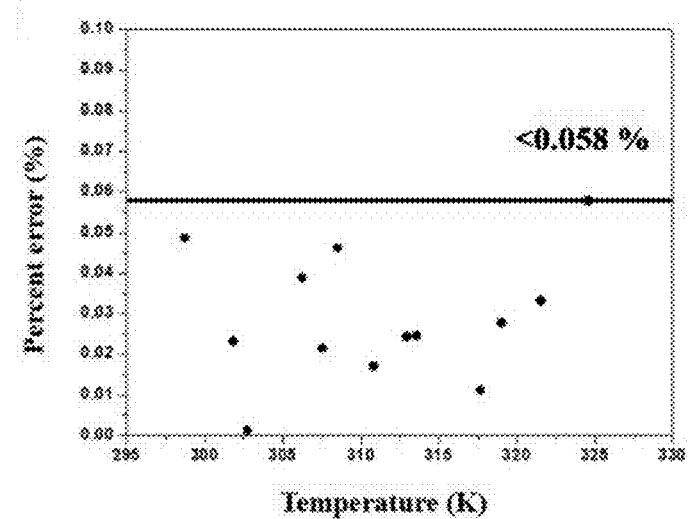
Figure 4C:
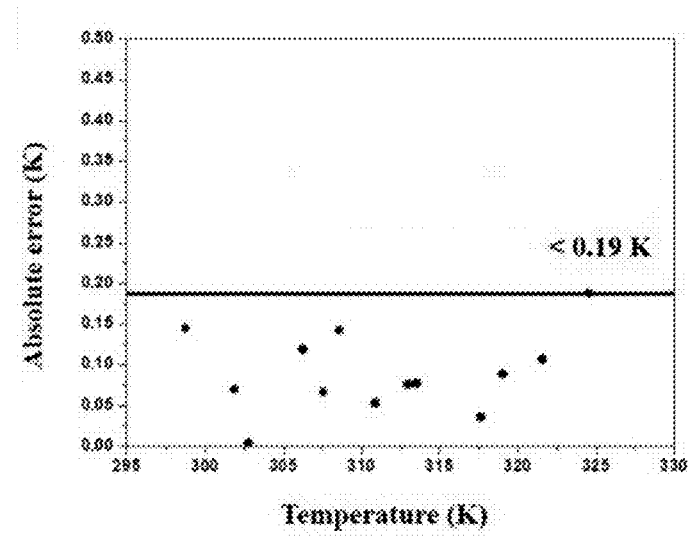
Figure 4D:
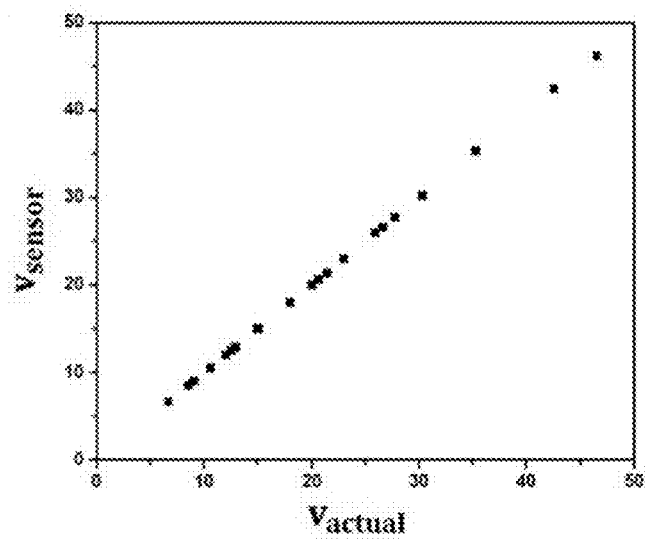
Figure 4E:
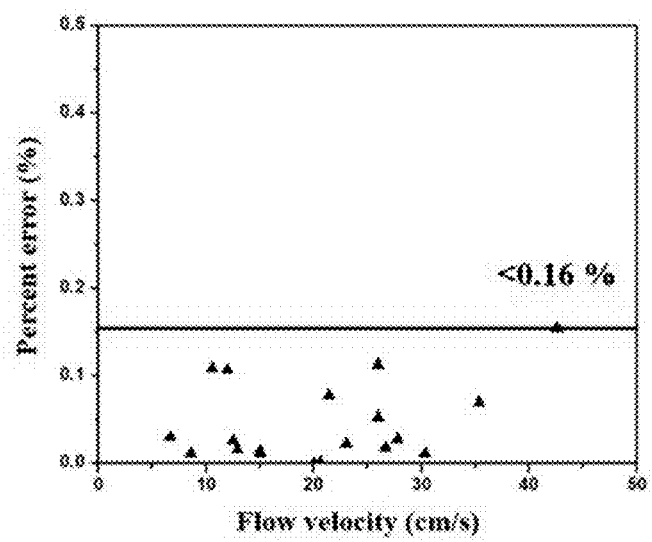
Figure 4F:
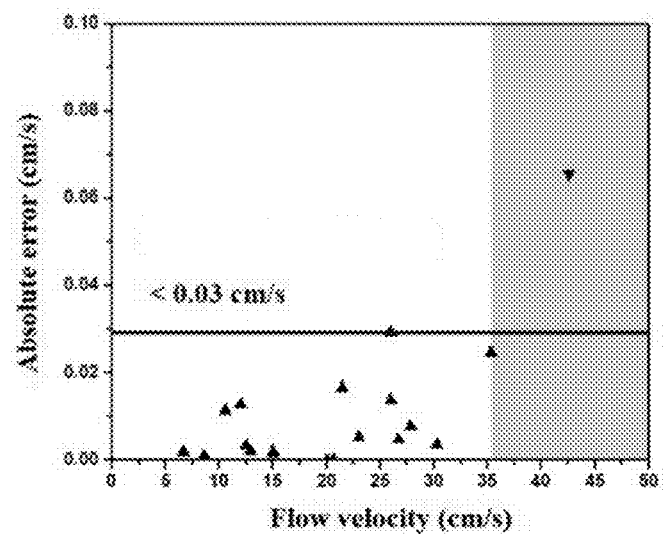

FIGS. 4B and 4C show the result of the comparison of temperature, and FIGS. 4E and 4F show the result of the comparison of flow velocity. FIGS. 4B and 4E show the percentages of the errors. Referring to FIG. 4B, the difference between an actual temperature and a temperature measured by the flexible sensor is less than or equal to 0.058%, which is an error of 0.19 K or less when he value is converted into Kelvin (K) unit as shown in FIG. 4C. Referring to FIG. 4C, the difference between an actual flow velocity and a flow velocity measured by the flexible sensor is less than or equal to 0.16%, which is an error of 0.03 cm/s or less when the value is converted into cm/s unit as shown in FIG. 4F. Therefore, it is confirmed that the flexible sensor of the present description has a very high accuracy for both the temperature and the flow velocity of a fluid.

Figure 5:
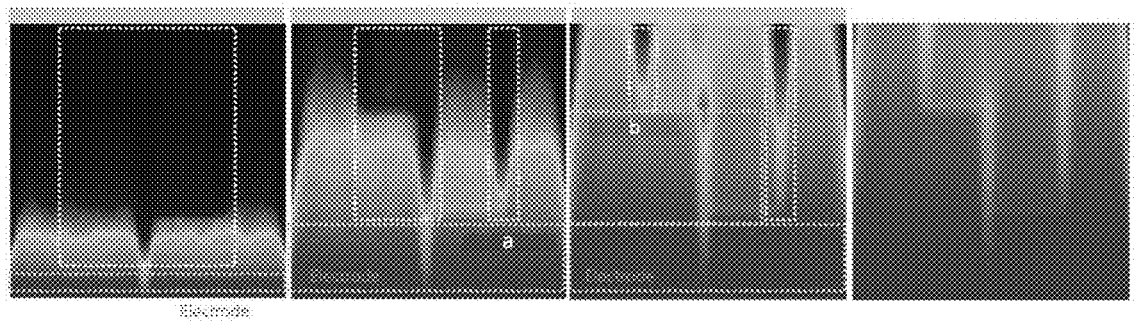

FIG. 5 is an analysis result of simulating an operating method of an example of a flexible sensor. When a lower electrode is assumed to be a first metal electrode 110 of the present description, a case where a fluid having a temperature flows from the direction of the first metal electrode 110 is simulated. When the fluid reaches the split point 131 on the thermoelectric body 130, the voltage is first observed. This voltage refers to a voltage observed at the time point b in FIG. 3B. When the fluid further flows and reaches a bending point before the third connection point 122, a voltage is secondly observed. This voltage refers to a voltage observed at the time point c in FIG. 3C. It is clear that the fluid will continue to eventually reach a thermal saturation state.

The physical analysis for the simulation of FIG. 5 is as follow. In the state where the heat source is stopped, the phenomenon that the flow of the electrons once caused by the thermoelectric effect is accelerated cannot be observed anymore. However, when the heat source is moving, a different aspect will be formed. In particular, in the case where the heat source moves in the direction of electron movement, it is possible to supply additional energy to the electrons once generated.

The specific situation is as follows. The electrons in the thermoelectric body are always moving in an arbitrary direction. In this case, if a fluid having thermal energy flows along the surface of the thermoelectric body, the electrons moving arbitrarily receive a sort of acceleration in the direction of thermal energy flow. As a result, the drift velocity of the electrons is accelerated so that the heat source moves in the same direction as the moving direction.

The acceleration as described above is continuously performed in the linear section without bending. Therefore, where a right-angle bend is included in geometric patterns of branches, an acceleration after a point where no more bend appears is the main cause of the voltage values measured, as shown in FIG. 5. The temperature of the fluid may be measured by converting inversely the voltage value obtained by the result of acceleration in the drift velocity in the $Y_1$ section. Since the voltage is observed at the time point c as a result of accelerating the drift velocity of a remaining portion of $Y_1$ apart from $Y_2$, it is possible to observe the flow velocity of a fluid using the difference value between the time points c and b. (see FIG. 3).

As long as the fact that the drift velocity can be accelerated by the moving source can be utilized, the data of the pattern would be measured by varying the geometric pattern of the branch from the split point 131 to the second connection point 121 and the geometric pattern of the branch from the split point 131 to the third connection point 122. Therefore, it should be noted that the scope of the protection of the present description is not limited by any specific geometric pattern.

As an example of the geometric patterns different from each other, it may be considered that the length from the split point 131 to the second connection point 121 and the length from the split point 131 to the third connection point 122 are different from each other. As another example, it may be considered that the bending structure from the split point 131 to the second connection point 121 and the bending structure from the split point 131 to the third connection point are different from each other.

Additionally, the bending structure refers to a curved form of a branch. The following may be considered as examples of different bending structures. It may be considered that when the first connection point 111 is defined as a zero point and the longitudinal direction of the flexible sensor is defined as an X axis, an X coordinate ($X_1$) of a bending point on the branch from the split point 131 to the second connection point 121 is different from the X coordinate ($X_2$) of a bending point on the branch from the split point 131 to the third connection point 122. It also may be considered as an example of different bending structures that the $X_1$ and the $X_2$ are the same but the angles at which the branch is bent are different from each other.

FIG. 6 is an exemplary view illustrating a connection pattern between a thermoelectric body 131 and metal electrodes of a flexible sensor. The geometric patterns of a branch from the split point 131 to the second connection point 121 and a branch from the split point 131 to the third connection point 122 are different from each other.

Figure 6A:
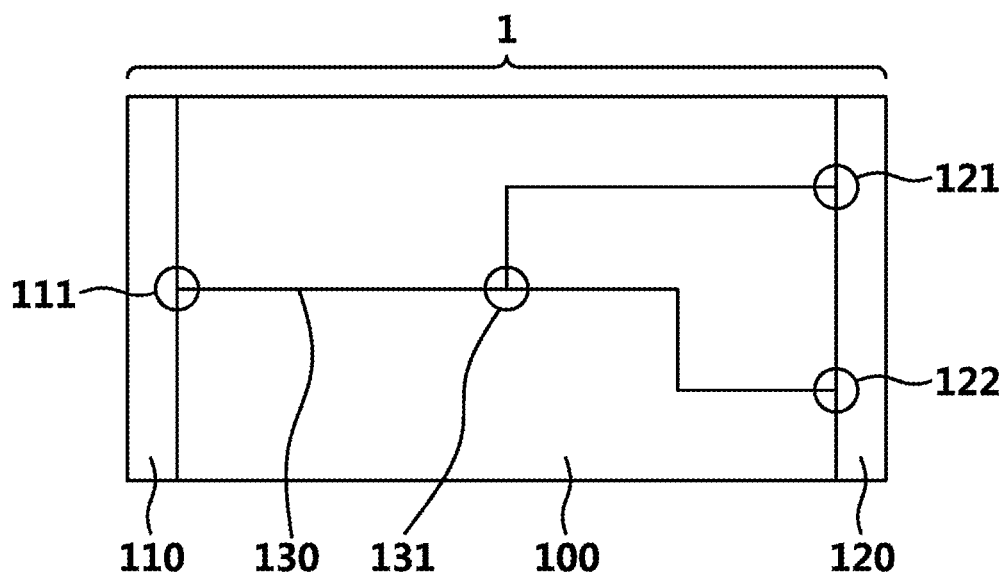
FIGS. 6A to 6C are exemplary views illustrating a connection pattern between a thermoelectric body 130 and metal electrodes of a flexible sensor.

FIG. 6A is a schematic diagram illustrating an example of the present description. It is seen that a bending structure of a thermoelectric body from a split point 131 to a second connection point 121 and a bending structure of the thermoelectric body from a split point 131 to a third connection point 122 are different. In detail, the values of $X_1$ and $X_2$ are different. In this case, a current through the third connection point 122 will be observed after a current through the second connection point 121 is observed first.

Figure 6B:
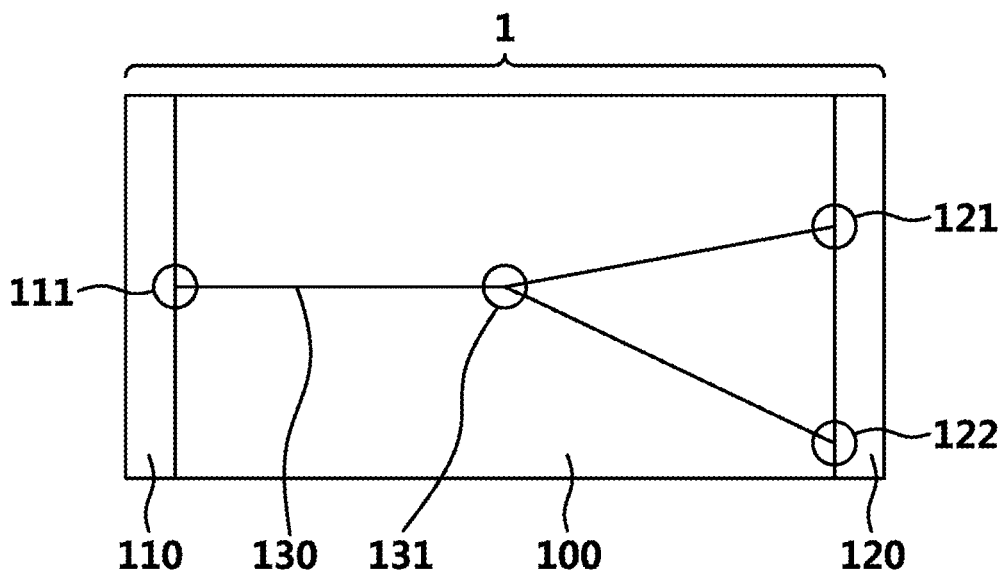

FIG. 6B shows an example when the values of $X_1$ and $X_2$ are the same. The duration values needed to measure the flow velocity may be obtained by differing the angles at which each thermoelectric layer is bent. In this case, a current through the second connection point 121 will be observed after a current through the third connection point 122 is observed first.

Figure 6C:
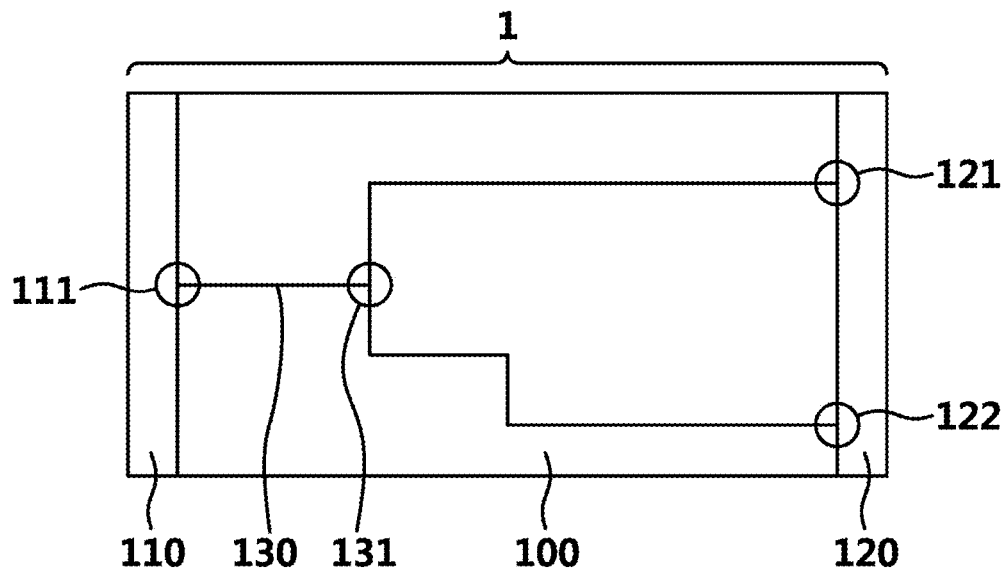

FIG. 6C shows an example of different bending structures by differing the number of bends in the branch between the split point 131 and the second connection point 121 and the number of bends in the branch between the split point 131 and the third connection point 122. In this case, a current through the second connection point 121 will be observed after a current through the third connection point 122 is observed first.

<Protection Layer of the Present Description>

A protection layer 140 of the present description is formed on the first metal electrode 110, second metal electrode 120, and the thermoelectric body 130. The term "formed on" refers to that a portion or the entire of the protection layer 140 covers the first metal electrode 110, the second metal electrode 120, and the thermoelectric body 130. Considering that the protection layer 140 is a layer introduced to prevent the direct contact between a fluid to be measured and the thermoelectric body 130, the protection layer 140 may cover one surface of the first metal electrode 110, the second metal electrode 120, and the thermoelectric body 130.

In the case that a fluid to be measured is directly in contact with the thermoelectric body 130, there may be an advantage that the sensitivity of the sensor increases; whereas, the thermoelectric body 130 may be physically damaged by the fluid. Therefore, it is understood that one purpose of introducing the protection layer 140 is to extend the life of the flexible sensor of the present description. As another purpose of the protection layer 140, the prevention of the fluid contamination due to dissolution of the thermoelectric body is considered. Depending on situations, a plurality of protection layers 140 may be introduced.

The examples of the protection layer 140 may be one layer or more made of at least one of $SiO_2$, SiNx, $Al_2O_3$, $Ta_2O_5$, BST, PZT, poly methylmethacrylate (PMMA), polystyrene (PS), phenolic polymer, acrylic polymer, imide polymer such as polyimide, aryl ether-based polymer, amide-based polymer, fluorine-based polymer, p-xylylene-based polymer, vinyl alcohol polymer, parylene, and a compound including at least one thereof.

However, the protection layer 140 is also one of the components of the flexible layer, so it is desirable to have flexibility. Therefore, the protection layer 140 may be one layer or more made of at least one of poly methylmethacrylate (PMMA), polystyrene (PS), phenolic polymer, acrylic polymer, imide polymer such as polyimide, aryl ether-based polymer, amide-based polymer, fluorine-based polymer, p-xylylene-based polymer, vinyl alcohol polymer, parylene, and a compound including at least one thereof.

In addition, the thickness of the protection layer 140 may be between about 1 μm and about 50 μm. If the thickness of the protection layer 140 is greater than or equal to 50 μm, the sensitivity is significantly reduced when measuring the temperature and flow velocity of the fluid, so it is substantially impossible to measure the temperature and the flow velocity. If the thickness of the protection layer 140 is less than or equal to 1 μm, there will be such problems that cracks may occur in the protection layer 140, the protection layer 140 may be peeled, and a fluid such as water penetrates the protection layer 140.

<Flexible Sensor Array of the Present Description>

This disclosure introduces a flexible sensor array including a plurality of flexible sensors, of which each thermoelectric body 130 is partially or entirely exposed to a fluid to be measured, the flexible sensors are connected in parallel. It is desirable that the flexible sensors included in the flexible sensor array have the same geometric patterns in terms of ease of data analysis, but the present description is not necessarily limited thereto. The fact that they are connected in parallel refers to that they are connected in parallel from an electrical point of view and whether each flexible sensor is physically separated does not matter. However, it is not impossible to imagine a flexible sensor array connected in series depending on the use of the flexible sensor array.

FIG. 7 is a structural view and a photograph of a flexible sensor array of the present description and shows a result of measuring the temperature and flow velocity of a fluid spreading over a large area. The flexible sensor array of FIG. 7 is a 4×4 type in which sixteen flexible sensors are electrically connected and four flexible sensors are arranged in each row and each column.

Figure 7A:
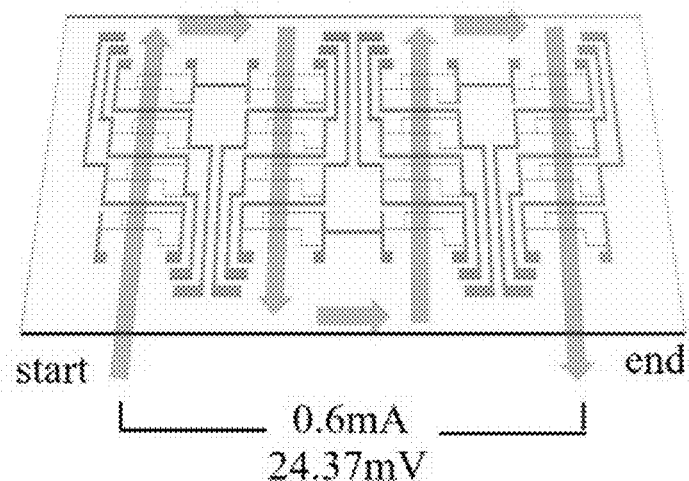
FIGS. 7A and 7B are a structural view and a photograph of a flexible sensor array of the present description, respectively.
Figure 7B:
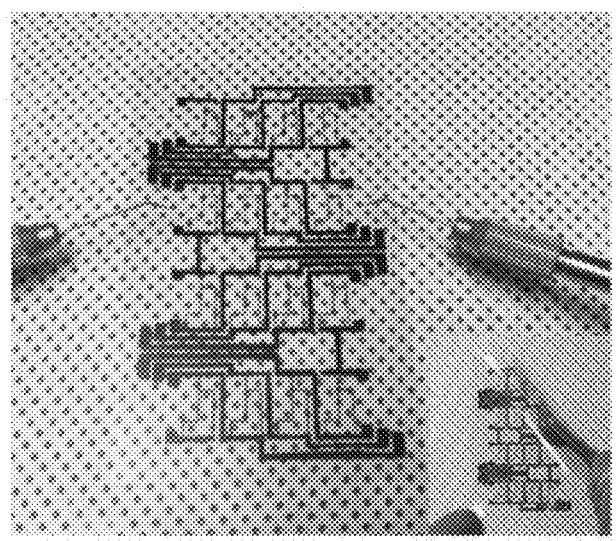

FIG. 7A is a schematic diagram illustrating an example of a flexible sensor array. Data is collected sequentially in the order of the arrows. FIG. 7B is an actual photograph of an example of a flexible sensor array. It is seen that the flexible sensor array may be fabricated in the form of a thin film and the normal function is operated in spite of more than 90 degree transformation.

Figure 7C:
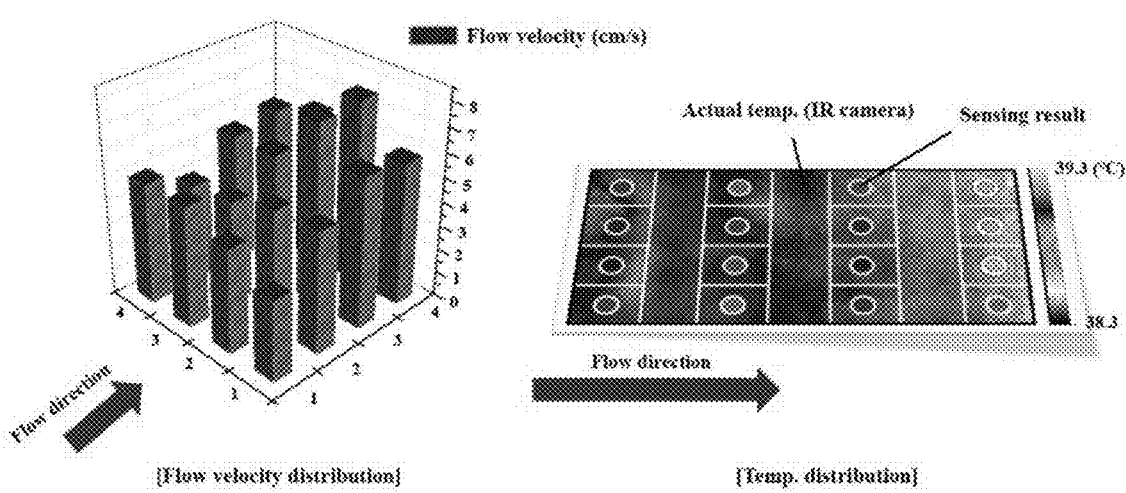
FIG. 7C shows a result of measuring by the flexible sensor array the temperature and flow velocity of a fluid spreading over a large area.

FIG. 7C shows the result of measuring the flow velocity and the temperature of a fluid at each point by respective flexible sensors included in the flexible sensor array. The fluid to be measured flows along an arrow from the lower left to the upper right or from left to right. The flow velocity is presented using bars in the unit of cm/s.

The temperature is presented using colors in the unit of ° C. In the temperature measurement result, the color indicated in each circle indicates the fluid temperature measured by the flexible sensor located at each corresponding point. The other color distributions represent the temperature distribution of the actual fluid measured by an IR camera and so on. It is seen that the flexible sensor array is able to measure the temperature distribution over the fluid spreading over a large area with a very high accuracy.

In short, it is seen that the temperature and the flow velocity of a fluid spreading over a large area both may be measured using the flexible sensor array. Therefore, the use of the flexible sensor array enables the collection of the characteristics of a fluid at a specific point and the movements.

The flexible sensor array may measure the temperature of a fluid by converting inversely a voltage value generated by measuring the temperature of the fluid. In particular, it should be noted that the thermoelectric body 130 of the flexible sensor generates a voltage in the process of measuring the temperature of the fluid. This means that the flexible sensor is a sensor and at the same time a generator. Therefore, the flexible sensor has the advantage that it is driven without an additional power source. For example, in the case of the flexible sensor array of FIG. 7, self-power generation with an average current of 24.37 mV*0.6 mA is possible by measuring the temperature and the flow velocity of the fluid of 312 K on average.

EMBODIMENTS AND TESTS

Embodiments and Comparison

1. Embodiment 1a: $Y_1$ is 15 mm and $Y_2$ is Constant

The PET film is washed with ethanol and Di water, and then cut to a size of 15*20 cm to prepare a substrate 100. An RF magnetron sputtering method was used to deposit a thermoelectric body 130 on the PET substrate 100, and it was performed under the condition of: for 25 minutes at a room temperature, at a pressure of 28 μtorr, at an argon flow rate of 20 sccm and at a gun power of 100 W. In order to pattern a specific shape of the thermoelectric body 130, the sputtering process was carried out while converting the PET substrate 100 with a 70-80 μm thick shadow mask made of SUS 304. The length of $Y_1$ was 15 mm and the length of $Y_2$ is 10 mm.

After the process was completed, the sputtered thermoelectric body 130 was covered with a mask, and then a first metal electrode 110 and a second metal electrode 120 were deposited using a DC magnetron sputtering method. The sputtering process was carried out under the condition of: at room temperature, at a pressure of 42 μtorr, at an argon flow rate of 50 sccm and at a gun power of 30 W (300 V, 100 mA) for 1 hour. As the target materials for the sputtering method process, $Bi_2Te_3$ of 5N purity was used for the thermoelectric body 130 and Cu of 4N of purity was used for the first metal electrode 110 and the second metal electrode 120, and the backplate was attached to prevent the damage due to the oxidation of targets. After the deposition of the first metal electrode 110 and the second metal electrode 120 was completed, a Polytetrafluoroethylene (PTFE) tape was attached on the thermoelectric body 130 and the first metal electrode 110 and the second metal electrode 120 to prevent the damage to the surface.

2. Embodiment 1b: $Y_1$ is 18.8 mm and $Y_2$ is Constant

This embodiment was performed in the same manner as in example 1a only except that the pattern of the shadow mask was changed. As a result, a flexible sensor having a length of $Y_1$ of 18.8 mm and $Y_2$ of 10 mm was obtained.

3. Embodiment 1c: $Y_1$ is 20 mm and $Y_2$ is Constant

This embodiment was performed in the same manner as in example 1a only except that the pattern of the shadow mask was changed. As a result, a flexible sensor having a length of $Y_1$ of 20 mm and $Y_2$ of 10 mm was obtained.

4. Embodiment 1d: $Y_1$ is 22.5 mm and $Y_2$ is Constant

This embodiment was performed in the same manner as in example 1a only except that the pattern of the shadow mask was changed. As a result, a flexible sensor having a length of $Y_1$ of 22.5 mm and $Y_2$ of 10 mm was obtained.

5. Embodiment 2a: $Y_1$ is Constant and $Y_2$ is 6.6 mm

This embodiment was performed in the same manner as in example 1a only except that the pattern of the shadow mask was changed. As a result, a flexible sensor having a length of $Y_1$ of 15 mm and $Y_2$ of 6.6 mm was obtained.

6. Embodiment 2b: $Y_1$ is Constant and $Y_2$ is 10 mm

This embodiment was performed in the same manner as in example 1a only except that the pattern of the shadow mask was changed. As a result, a flexible sensor having a length of $Y_1$ of 15 mm and $Y_2$ of 10 mm was obtained.

7. Embodiment 2c: $Y_1$ is Constant and $Y_2$ is 12.5 mm

This embodiment was performed in the same manner as in example 1a only except that the pattern of the shadow mask was changed. As a result, a flexible sensor having a length of $Y_1$ of 15 mm and $Y_2$ of 12.5 mm was obtained.

8. Embodiment 2d: $Y_1$ is Constant and $Y_2$ is 15 mm

This embodiment was performed in the same manner as in example 1a only except that the pattern of the shadow mask was changed. As a result, a flexible sensor having a length of $Y_1$ of 15 mm and $Y_2$ of 15 mm was obtained

9. Comparison Example 1: There is No Thermoelectric Body 130

This embodiment was performed in the same manner as in embodiment 1a only except that a step of depositing the thermoelectric body 130 was excluded. As a result, a sensor without the thermoelectric body 130 was obtained.

<Evaluation of Functions of Embodiments and Comparison Example>

FIG. 8 shows data obtained by measuring the temperature and the flow velocity of a fluid by differing longitudinal variables of branches of a thermoelectric body included in the flexible sensor.

Figure 8A:
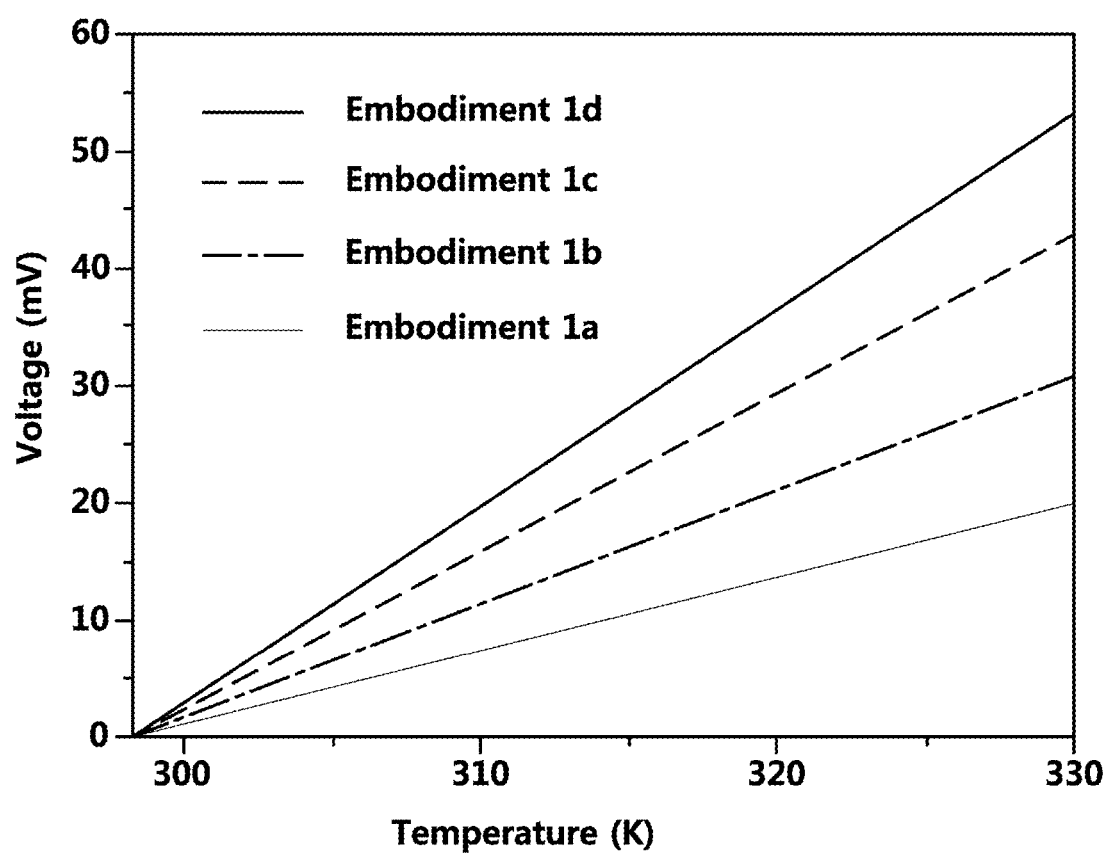
FIGS. 8A and 8B show data obtained by measuring temperature and flow velocity of a fluid by differing longitudinal variables of branches of a thermoelectric body 130 included in a flexible sensor, respectively.

FIG. 8A illustrates the result of measuring the temperature of the fluid by the flexible sensor of embodiments 1a to 1d. A solid line with the smallest slope is the measurement result of embodiment 1a, and a solid line with the second smallest slope is the measurement result of embodiment 1b. The solid line with the greatest slope is the measurement result of embodiment 1d. Referring to the measurement results of each embodiment, it was found that the voltage change according to the temperature change was the largest in the case of embodiment 1d. This means that as the length of $Y_1$ increases, the sensitivity to the temperature of a fluid increases. Therefore, it is expected that as the length of the branch from the split point 131 to the second connection point 121 becomes longer, a sensor with higher sensitivity to the temperature of the fluid will be obtained.

Figure 8B:
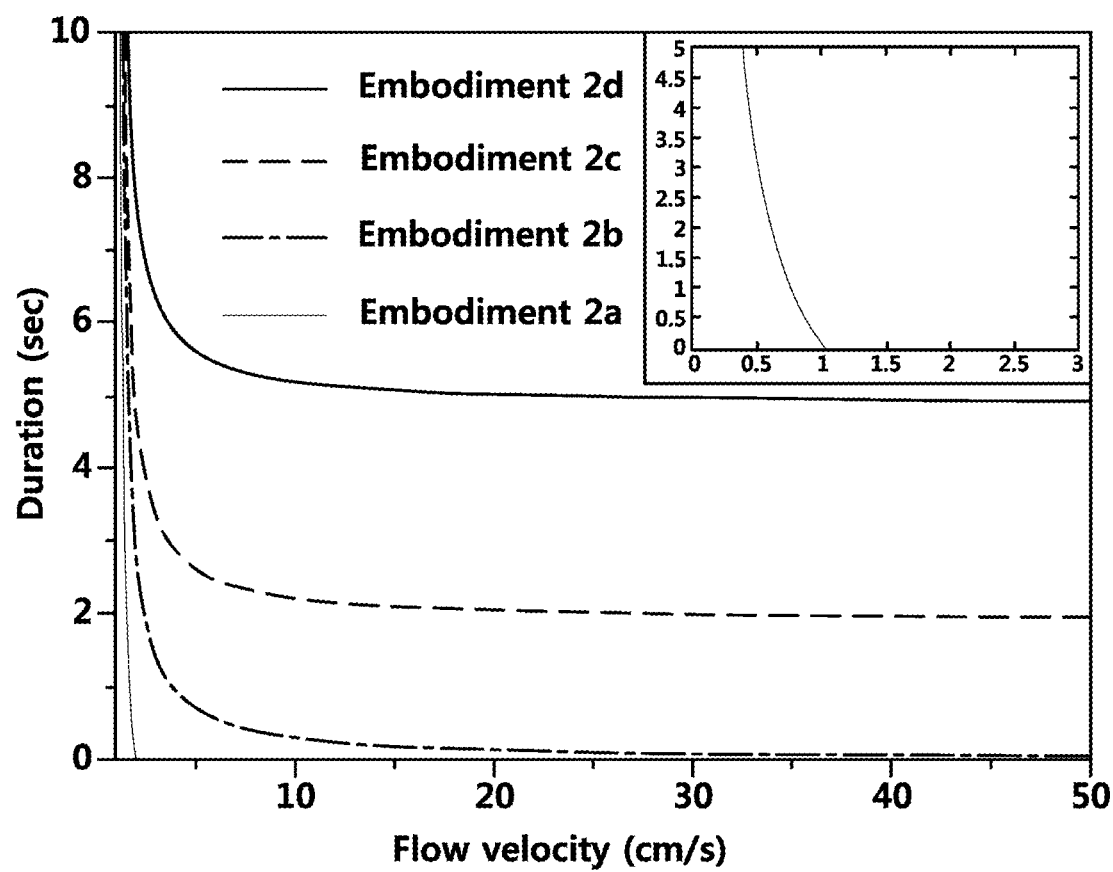

FIG. 8B shows the result of measuring the flow velocity of fluid by the flexible sensor of embodiments 2a to 2d. A solid line with the greatest change in the slope shows the measurement result of embodiment 2a. A solid line with the second greatest change in the slope shows the measurement result of embodiment 2b. A solid line with a gradual change in the slope is the measurement result of embodiment 2d. Referring to FIG. 8B, it is seen that as the value of $Y_2$ increases, the duration value increases. This means that the sensitivity of the sensor to the flow velocity increases as $Y_2$ increases.

In the case of embodiments 1a to 1d and 2a to 2d, it was successful to measure both temperature and flow velocity of a fluid although there was a difference in sensitivity to temperature and flow velocity; on the other hand, in the case of comparison example 1, it was failed to measure the temperature and the flow velocity of a fluid. This is the result of demonstrating that among the various elements of the present description, the thermoelectric body 130 is the most important factor in measuring the temperature and the flow velocity of a fluid.

<Tests and Function Evaluations>

1. Test of Flexible Sensor Having Geometric Pattern in a Curved Shade where X is 5, $Y_1$ is 15, and $Y_2$ is 20

The following test was conducted to verify that the flexible sensor of the present description functions normally even when the sensor is physically transformed. FIG. 9 shows data of temperature and flow velocity of a fluid measured when changing only the curvature of the flexible sensor.

Figure 9A:
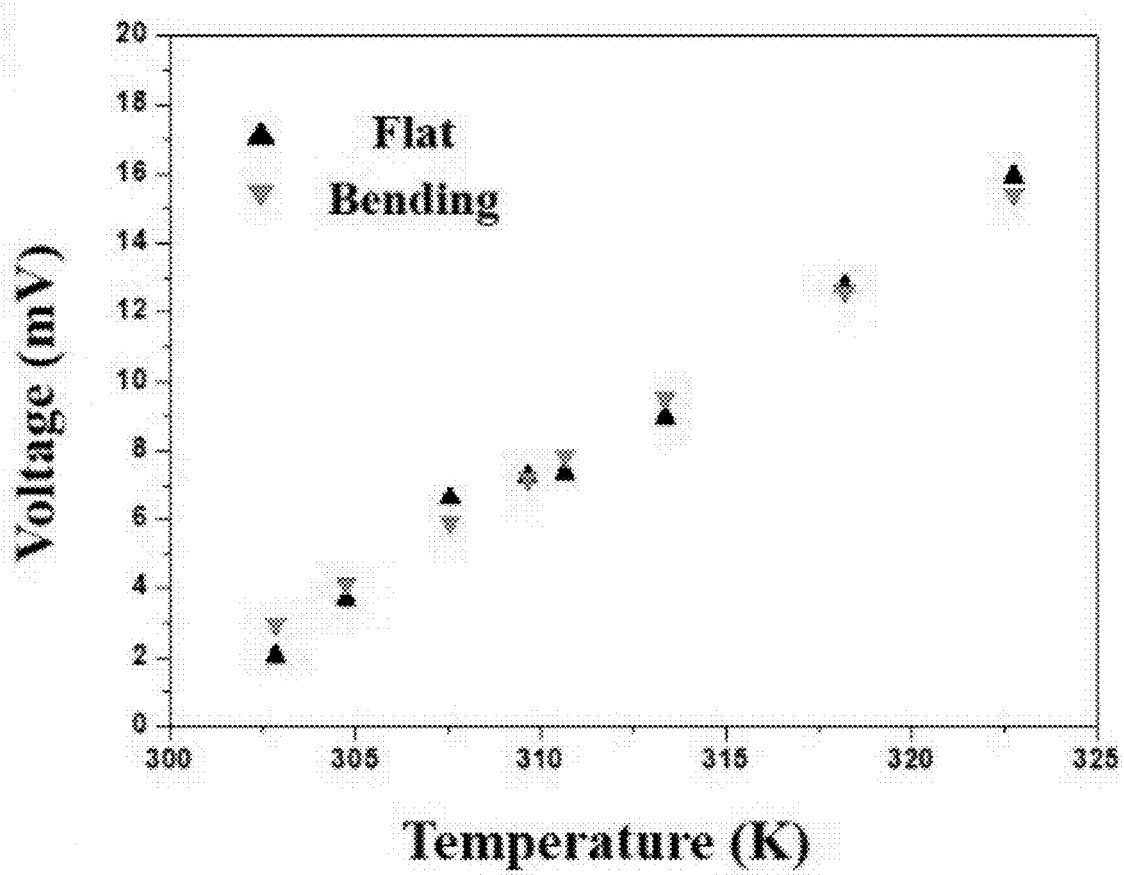
FIGS. 9A and 9B show data of temperature and flow velocity of a fluid measured when changing only curvature of a flexible sensor, respectively.

FIG. 9A shows the comparison of a result of measuring the temperature of a fluid by attaching a flexible sensor having a geometric pattern of X is 5, $Y_1$ is 15, and $Y_2$ is 20 inside a tube having a radius of 24 mm and a result of measuring the temperature by attaching the flexible sensor to a flat surface. The upward arrow indicates the case where the flexible sensor is attached to the plane, and the downward arrow indicates the case where the flexible sensor is attached to the curved surface of the tube. When comparing the measured values, it is seen that the measured voltage values are similar in spite of the severely physical transformation.

Figure 9B:
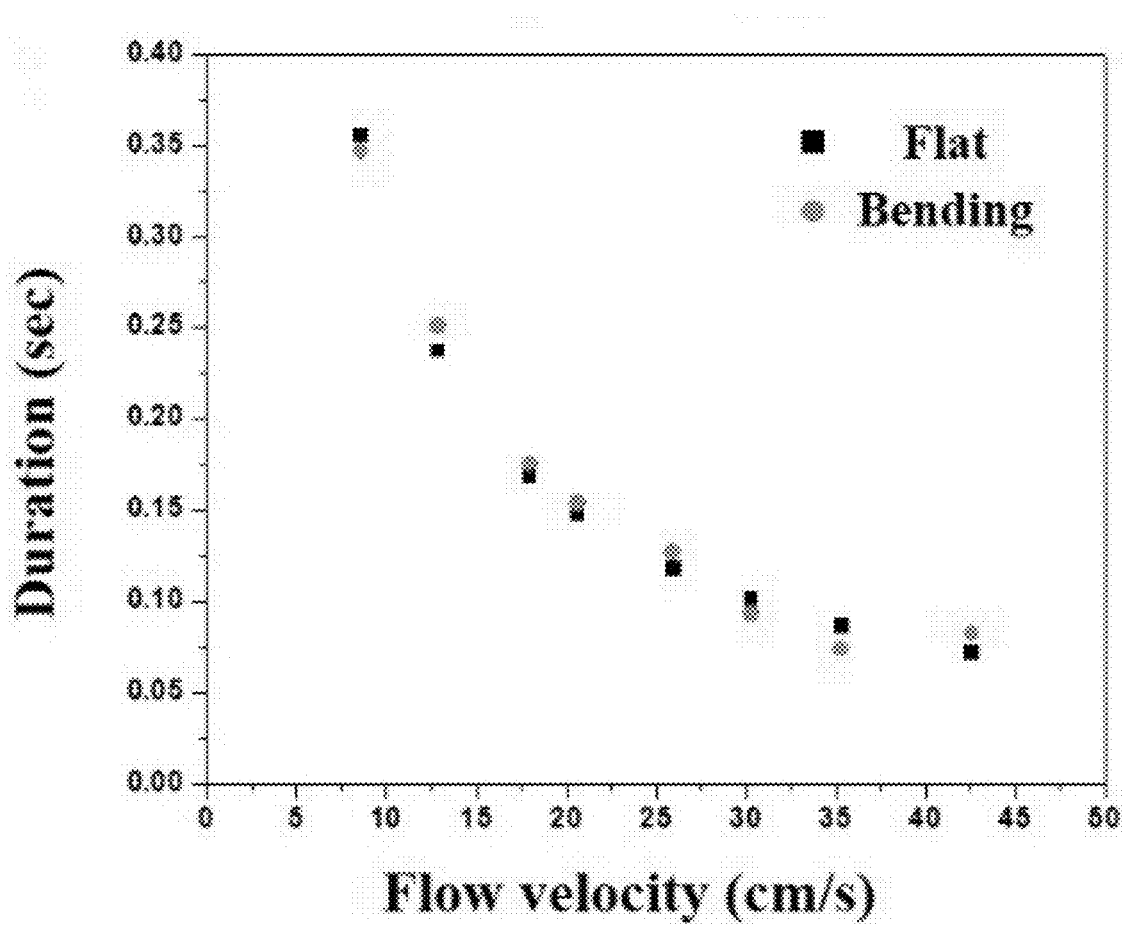

FIG. 9B shows the comparison of a result of measuring the flow velocity of a fluid by attaching a flexible sensor having a geometric pattern of X is 5, $Y_1$ is 15, and $Y_2$ is 20 inside a tube having a radius of 24 mm and a result of measuring the flow velocity by attaching the flexible sensor to a plane. The square points are the case where the flexible sensor is attached to the plane, and the circle points are the case where the flexible sensor is attached to the curved surface of the tube. It is seen that although there are fine differences depending on curvature, the measured voltage values are very similar.

Based on the above data, it is seen that the flexible sensor is able to measure both temperature and flow velocity of a fluid with a high accuracy regardless of the presence or absence of curvature according to physical transformation. This means that the flexible sensor of the present description can be easily used being attached to objects, such as tubes, having various curvatures.

2. Test for Continual Measurements of Flexible Sensor Having Geometric Pattern where X is 5, $Y_1$ is 15, and $Y_2$ is 20.

Figure 10:
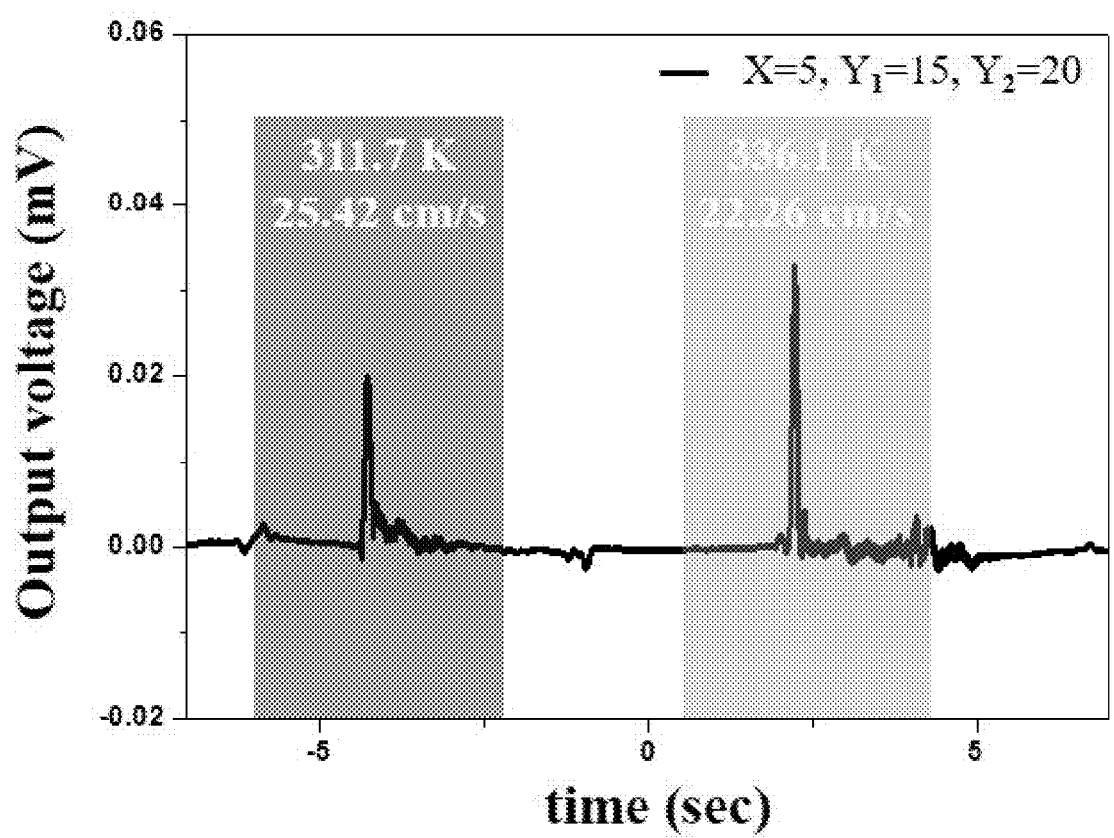
FIG. 10 shows data for confirming whether a flexible sensor can continuously measure temperature and flow velocity of a newly added fluid in the case that another fluid is added while the flexible sensor is already measuring the temperature and flow velocity of a fluid.

FIG. 10 shows data for confirming whether the flexible sensor can continuously measure the temperature and flow velocity of a newly added fluid in the case that another fluid is added while the flexible sensor is already measuring the temperature and flow velocity of a fluid. The flexible sensor was added to the plane, and the temperature and flow velocity was measured by differing the property of fluids to be measured.

Referring to FIG. 10, a fluid to be first measured had a temperature of 311.7 K and a flow velocity of 25.42 cm/s. After the fluid started to flow and a predetermined time has elapsed, a fluid to be second measured continuously passed through the flexible sensor. The second target fluid had a temperature of 335.1 K and a flow velocity of 22.26 cm/s. In particular, in FIG. 10, since the fluids continuously flow on the flexible sensor, a peak in which the voltage value is negative did not appear, which proves that the flexible sensor can continuously sense fluids. Also, in consideration of the test result, it is determined that the flexible sensor is capable of continuous measurement of fluids having different properties.

In conclusion, the flexible sensor may have high accuracy in measuring temperature and flow rate of fluids and also observe changes in temperature and flow velocity in real time. In addition, the flexible sensor may measure the temperature and flow velocity of the fluid with high accuracy even when attached to a curved surface, and the measurement allows self-power generation.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A flexible sensor comprising:
a flexible substrate;
a thermoelectric body formed on the flexible substrate;
a first metal electrode that is formed on the flexible substrate and is connected to one end of the thermoelectric body; and
a second metal electrode that is formed on the flexible substrate and is connected to another end of the thermoelectric body but spaced apart from the first metal electrode,
wherein the thermoelectric body comprises a first connection point connected to the first metal electrode at one point, and a second connection point and a third connection point connected to the second metal electrode and spaced apart from each other,
wherein the thermoelectric body branches at a split point spaced apart from the first connection point, and is connected to the second connection point and the third connection point, and
wherein a length of a branch of the thermoelectric body from the split point to the second connection point and a length of a branch of the thermoelectric body from the split point to the third connection point are different from each other.

2. The flexible sensor of claim 1, further comprising a protection layer formed on the first metal electrode, the second metal electrode, and the thermoelectric body.

3. The flexible sensor of claim 2, wherein
a bending structure of the branch of the thermoelectric body from the split point to the second connection point and a bending structure of the branch of the thermoelectric body from the split point to the third connection point are different from each other.

4. The flexible sensor of claim 2, wherein a thermoelectric element comprised in the thermoelectric body comprises at least one selected from the group consisting of bismuth chalcogenide compounds and antimony chalcogenide compounds.

5. The flexible sensor of claim 4, wherein thickness of the thermoelectric body is in a range of about 50 nm to about 1 µm.

6. The flexible sensor of claim 5, wherein the protection layer comprises at least one selected from the group of poly methyl methacrylate, polystyrene, phenolic polymer, acrylic polymer, imide polymer such as polyimide, aryl ether-based polymer, amide-based polymer, fluorine-based polymer, p-xylylene-based polymer, vinyl alcohol polymer, parylene, and a compound comprising at least one thereof.

7. The flexible sensor of claim 6, wherein a thickness of the protection layer is in a range of about 1 µm to about 50 µm.

8. A flexible sensor array comprising a plurality of the flexible sensors of claim 7, wherein each thermoelectric body of the plurality of flexible sensors is partially or entirely exposed to a fluid to be measured, and the plurality of the flexible sensors are connected to each other in parallel.

9. The flexible sensor of claim 1, wherein
a bending structure of the branch of the thermoelectric body from the split point to the second connection point and a bending structure of the branch of the thermoelectric body from the split point to the third connection point are different from each other.

10. The flexible sensor of claim 1, wherein a thermoelectric element comprised in the thermoelectric body comprises at least one selected from the group consisting of bismuth chalcogenide compounds and antimony chalcogenide compounds.

11. The flexible sensor of claim 10, wherein thickness of the thermoelectric body is in a range of about 50 nm to about 1 µm.

* * * * *